United States Patent
Lee et al.

(10) Patent No.: US 6,643,201 B2
(45) Date of Patent: Nov. 4, 2003

(54) MEMORY DEVICE HAVING READ CHARGE CONTROL, WRITE CHARGE CONTROL AND FLOATING OR PRECHARGE CIRCUITS

(75) Inventors: Won-Seok Lee, Gyeonggi-do (KR); Chang-Yong Lee, Suwon (KR); Jung-Bae Lee, Gyeonggi-do (KR); Won-Chang Jung, Gyeonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/205,838

(22) Filed: Jul. 26, 2002

(65) Prior Publication Data

US 2003/0021174 A1 Jan. 30, 2003

Related U.S. Application Data

(63) Continuation-in-part of application No. 10/002,542, filed on Nov. 13, 2001.
(60) Provisional application No. 60/308,195, filed on Jul. 26, 2001.

(30) Foreign Application Priority Data

Jan. 2, 2002 (KR) .................................. 2002-0000087

(51) Int. Cl.$^7$ ............................................... G11C 7/00
(52) U.S. Cl. ................... 365/205; 365/189.04; 365/202
(58) Field of Search ............................... 365/205, 202, 365/189.01, 189.04, 196, 203

(56) References Cited

U.S. PATENT DOCUMENTS

| | | | |
|---|---|---|---|
| 5,982,690 A | * | 11/1999 | Austin .......................... 365/205 |
| 6,084,803 A | | 7/2000 | Sredanovic et al. |
| 6,151,265 A | * | 11/2000 | Takita et al. ........... 365/230.03 |

OTHER PUBLICATIONS

Taguchi et al. "A 40-ns 64-Mb DRAM with 64-b Parallel Data Bus Architecture" *Journal of Solid State Circuit, vol. 26, No. 11*, pp 1493–1497, IEEE Nov. 1991.

* cited by examiner

*Primary Examiner*—Thong Le
(74) *Attorney, Agent, or Firm*—Marger Johnson & McCollom, P.C.

(57) ABSTRACT

A memory charging circuit includes a read charge control circuit controlled according to a read control signal and an address value. A write charge control circuit is controlled according to a write control signal and the same or a different address value. Charging to and charging from the same data IO lines is controlled using the read charge amplifier circuit and the write charge amplifier circuit. A column select line circuit can be configured into a first arrangement where a first output is activated according to a read control signal and an address and a second output is activated according to a write control signal and the same or a different address. In a second arrangement, the first output is activated according to an address and either the read control signal or the write control signal.

5 Claims, 16 Drawing Sheets

US 6,643,201 B2

MEMORY DEVICE HAVING READ CHARGE CONTROL, WRITE CHARGE CONTROL AND FLOATING OR PRECHARGE CIRCUITS

This application relies for priority upon Korean Patent Application No. 2002-00087, filed on Jan. 2, 2002; and is a continuation-in-part to provisional application Serial No. 60/308,195 filed on Jul. 26, 2001, and non-provisional application Serial No. 10/002,542 filed on Nov. 13, 2001, the contents of which are herein incorporated by reference in their entirety.

BACKGROUND

FIG. 1 shows a typical data path structure having a Bit Line Sense Amplifier (BLSA) PSA, NSA, LA, LAB, Data Input/Output lines (DIO,DIOB), a Column Select Line (CSL), a Memory Cell (MC), a capacitor C and an access transistor N5, a Bit Line (BL), a Complementary Bit Line (BLB), a Data output sense amplifier 10, Loads (L1,L2), and a Word Line (WL). The term DIOB refers to a complementary data IO line. A typical BLSA includes a PMOS sense amplifier (PSA) and an NMOS sense amplifier (NSA) connected to the BL and the BLB respectively.

A read operation is performed as follows. Before WL activation, the BL and the BLB are pre-charged to the same voltage level by a VBL voltage generator and an equalizing and pre-charging circuit (not shown). The VBL level is approximately half the voltage level of VCC. If a row active command in combination with a row address is applied to a DRAM, a WL relevant to the row address is activated. The charge in a capacitor C couples and shares with the charge of the BL. This is referred to as a "Charge Sharing (CS)" operation.

A slight voltage difference between BL and BLB is generated by the CS operation and then sense-amplified by the PSA and NSA circuits in conjunction with the sense amplifier enabling signals LA and LAB. If the charge in the capacitor C is logically "high" (i.e., "VCC"),then the BL is logically "high" and the BLB is logically "low" during the CS operation and sense-amplifying operation. The amplified data in the BL/BLB are transferred to the DIO/DIOB lines in response to a CSL signal through transistors N3 and N4, respectively. The CSL signal is enabled by a read command or write command in combination with a column address.

Two load transistors L1 and L2 are used by the data output sense amplifier 10. The load transistors L1 and L2 comprise a PMOS or NMOS transistor connected to a certain power voltage like a supply power or ground power voltage to provide a current to the DIO and DIOB lines during a read operation. The data transferred to the DIO and DIOB lines is amplified by the data output sense amplifier 10. The amplified data is output externally through a data output buffer 20 in response to a signal (not shown).

The time between a row active command and the output of data is called the access time (tRAC). The process technology of the prior art provides a charge sharing (CS) time of about 10 ns and an access time of about 40 nanoseconds (ns). In the BLSA structure shown in FIG. 1, the CS time and sense-amplifying time (SEN time) must take place before the CSL enables the charge from the BL and BLB lines onto the DIO and DIOB lines.

The capacitive loading of the DIO/DIOB lines is larger than that of the BL/BLB lines by about a factor of ten. If the CSL enables before BL sensing at a certain voltage level, e.g. a delta VBL of between about 0.5 Volts (V) and 1V then, the data on the BL and BLB lines cannot be sense-amplified. The voltage difference between the BL and BLB is called delta VBL. This BLSA structure is available for Dynamic Random Access Memories (DRAMs) that do not care about the CS and SEN times.

The access time tRAC can be reduced by reducing the CS time and SEN time. DRAMs with access times tRAC of about 20 ns are referred to as high-speed DRAMs or Fast Cycle Random Access Memory (FCRAM). Data input buffer 30 is used for the write operation. DIN is the data input. The data output sense amplifier 10 is used for read operations.

FIG. 2 shows a timing diagram for FIG. 1 when the read operation data is "1". Every command is synchronized with the rising edge of the clock signal CLOCK. A ROW ACTIVE command with address (row address) enables a specific Word Line (WL). A READ command with address (column address) enables the CSL signal. In the structure of FIG. 1, the CS time and SEN time should be completed before the CSL line is enabled. The enable point for the LA and LAB is determined by the memory chip designer. After the CSL is enabled, the data on the BL and BLB lines is transferred to the DIO and DIOB lines. Finally, the data on the DIO and DIOB lines is transferred to the data output buffer (DOUT) 20. DOUT is normally pre-charged at a high-impedence (Hi-Z) level before the data is transferred.

FIG. 3 shows a typical data path structure for a conventional high-speed Bit line Sense Amplifier (BLSA) in a semiconductor memory device. This BLSA is described in further detail in "A 40-ns 64-Mb DRAM with 64-b Parallel Data Bus Architecture" by Taguchi et. al. published in the IEEE Journal of Solid State Circuit, Vol.26, No.11, pp.1493–1497, November 1991".

FIG. 3 shows separate Column Select Lines (CSLs) WCSL and RCSL and separate data lines RDO/RDOB and WDI/WDIB for read and write operations, respectively. For the high-speed read operation, a direct sense amplifier is implemented in the BLSA and is referred to as a Read Sense Amplifier (RSA). The RSA operates like a differential amplifier. In this disclosure, Direct SA, RSA and differential amplifier mean the same thing. A slight voltage difference is amplified by the RSA. In this case, the RCSL enable timing can be faster than the CSL timing shown in the FIG. 1 scheme. A designer can select the CSL enable timing point, then design a shorter tRAC for the FCRAM.

Since RCSL may be activated even before the WL is activated, most of the CS time and SEN time is not required in this scheme. In other words, as soon as WL is activated, RCSL can be activated. If a slight voltage difference exists between the BL and the BLB, RSA amplifies the BL and the BLB without the PSA and NSA. Data errors seldom occur in this scheme. Although the loading of the DIO line is large, this differential amplifier RSA can amplify the slight difference of the voltage.

However, this scheme has a problem. By implementing the RSA, the read and write paths need to be implemented separately so that data contention does not occur during the read operation and write operations. This requires a larger IC layout area than any other sense amplifier schemes.

FIG. 4 shows a timing diagram for FIG. 3 when data is "1". As shown, RCSL reduces the enabling time. Most of the CS time and SEN time is not needed to enable the CSL. This provides faster RCSL enabling and as a result a shorter access time tRAC.

FIG. 5 shows another typical data path structure that includes a conventional high-speed BLSA for a semiconductor memory device. The WR signal is only used when a write command is entered. The WR signal does not include any address information. The CSL is used during both write and read operations. Data input lines and output lines are also commonly used. The DIOG3 includes 4 transistors, N11, N12, N13 and N14. The DIOG3 Data Input/Output gate transistors considerably increase the layout area in DRAMs. Another problem is an increase in the current consumption caused by the RSA operating for both read and write operations in response to the WR and CSL.

The present invention addresses these and other problems associated with the prior art.

SUMMARY OF THE INVENTION

A memory charging circuit includes a read charge control circuit controlled according to a read control signal and an address value. A write charge control circuit is controlled according to a write control signal and the same or a different address value. Charging to and charging from the same data IO lines is controlled using the read charge amplifier circuit and the write charge amplifier circuit.

A column select line circuit can be configured into a first arrangement where a first output is activated according to a read control signal and an address and a second output is activated according to a write control signal and the same or a different address. In a second arrangement, the first output is activated according to an address and either the read control signal or the write control signal.

The foregoing and other objects, features and advantages of the invention will become more readily apparent from the following detailed description of a preferred embodiment of the invention which proceeds with reference to the accompanying drawings.

DETAILED DESCRIPTION

Figure 5:
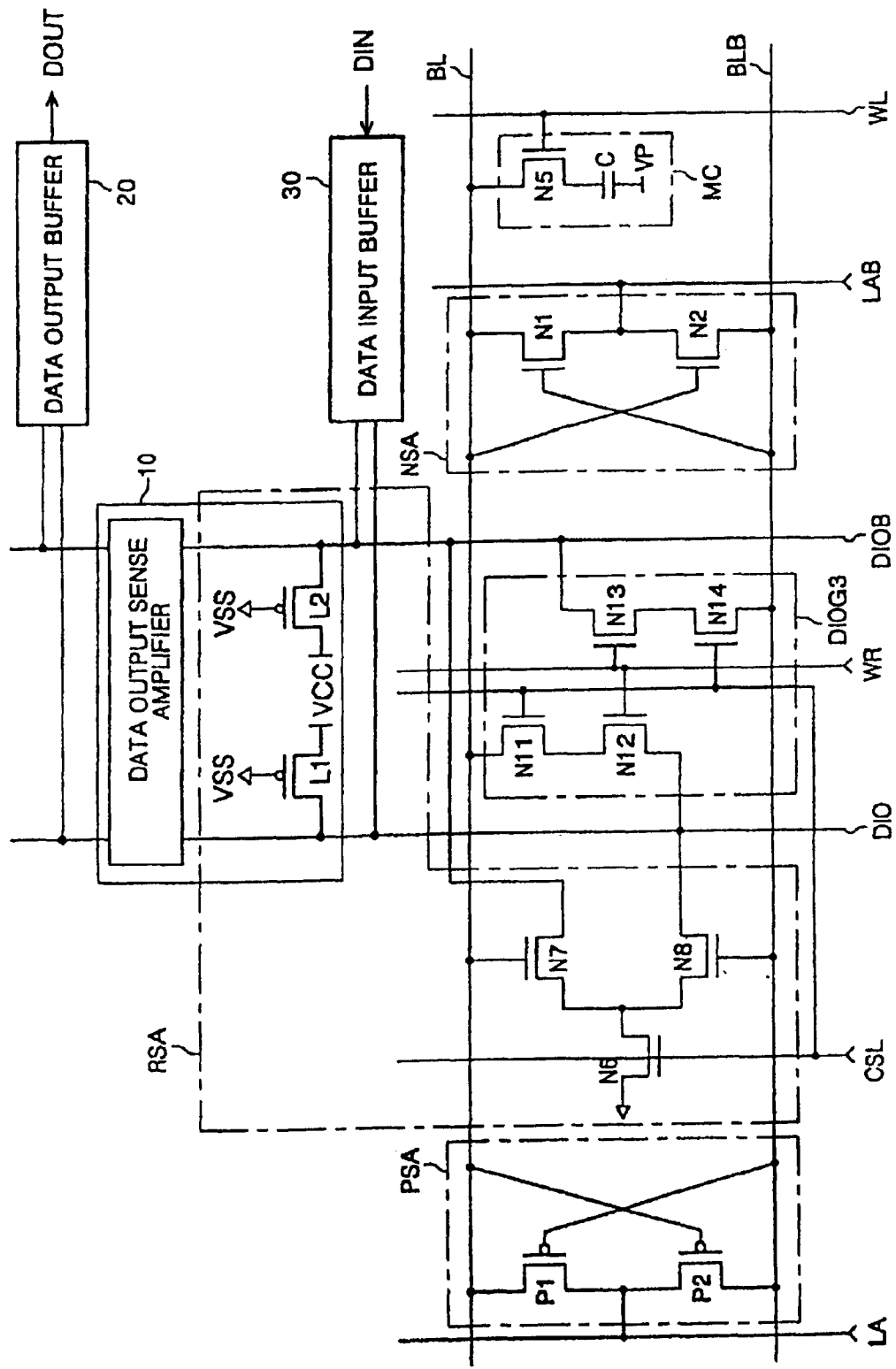
FIG. 5 is a circuit diagram of yet another data path structure.
Figure 6:
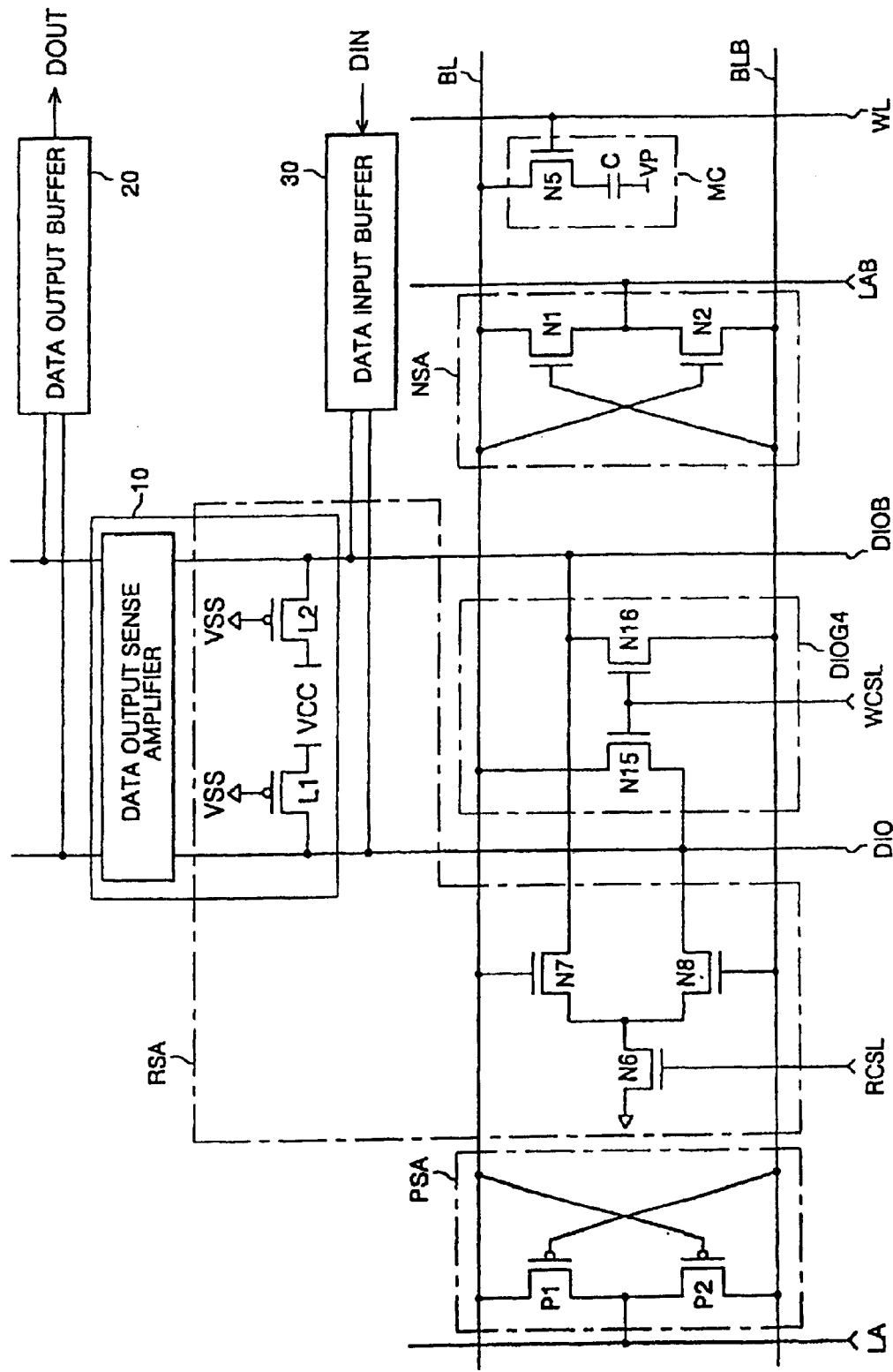
FIG. 6 is a diagram of a charge control circuit according to one aspect of the invention.

FIG. 6 shows an embodiment of data path structure having a new high-speed Bit Line Sensing Amplifier (BLSA) for a semiconductor memory device. The BLSA includes a PSA, NSA, RSA, DIOG4, RCSL, WCSL, DIO/DIOB, etc. that operate in a manner as described above. One difference between FIG. 6 and FIG. 5 is the DIOG4. The DIOG4 only has two transistors N15, N16. This reduces layout area in the memory core. Core refers to a portion of the memory cell arrays, Bit Lines (BLs), BLSA, and Word Line related circuits, etc.

Figure 1:
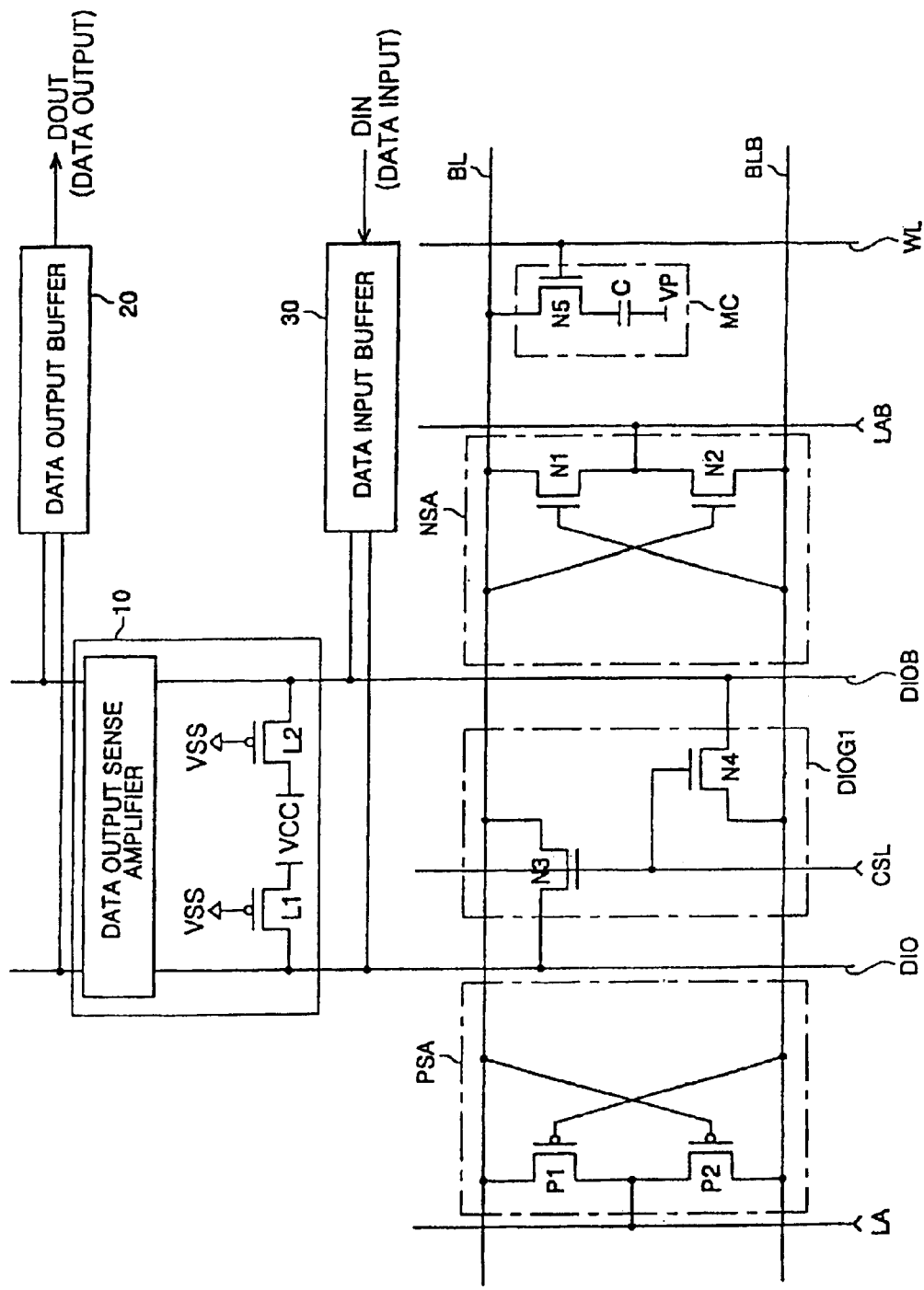
FIG. 1 is a diagram of a circuit diagram of a memory data path structure.
Figure 2:
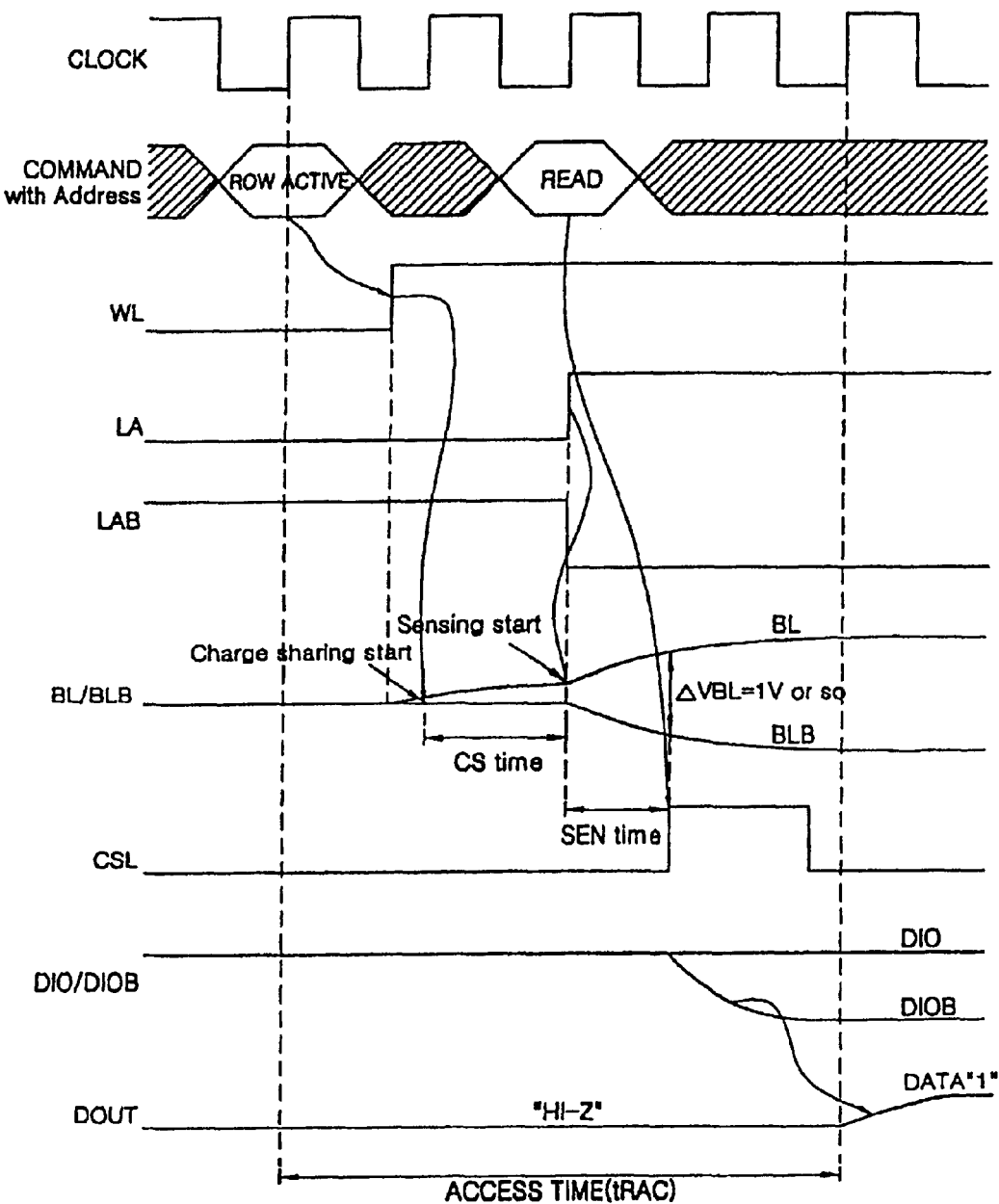
FIG. 2 is a timing diagram for the circuit of FIG. 1.
Figure 3:
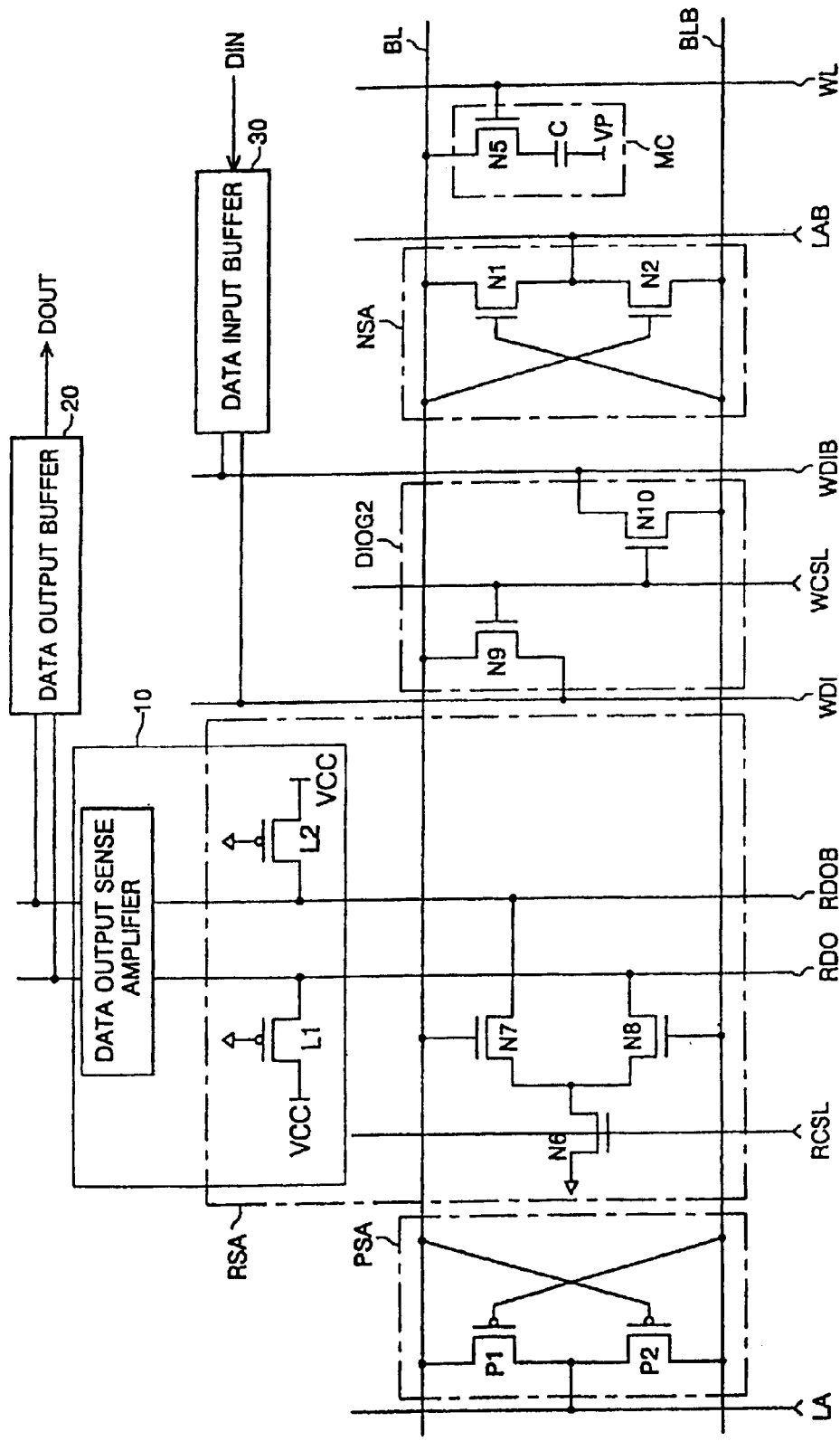
FIG. 3 is a circuit diagram of another memory data path structure.
Figure 4:
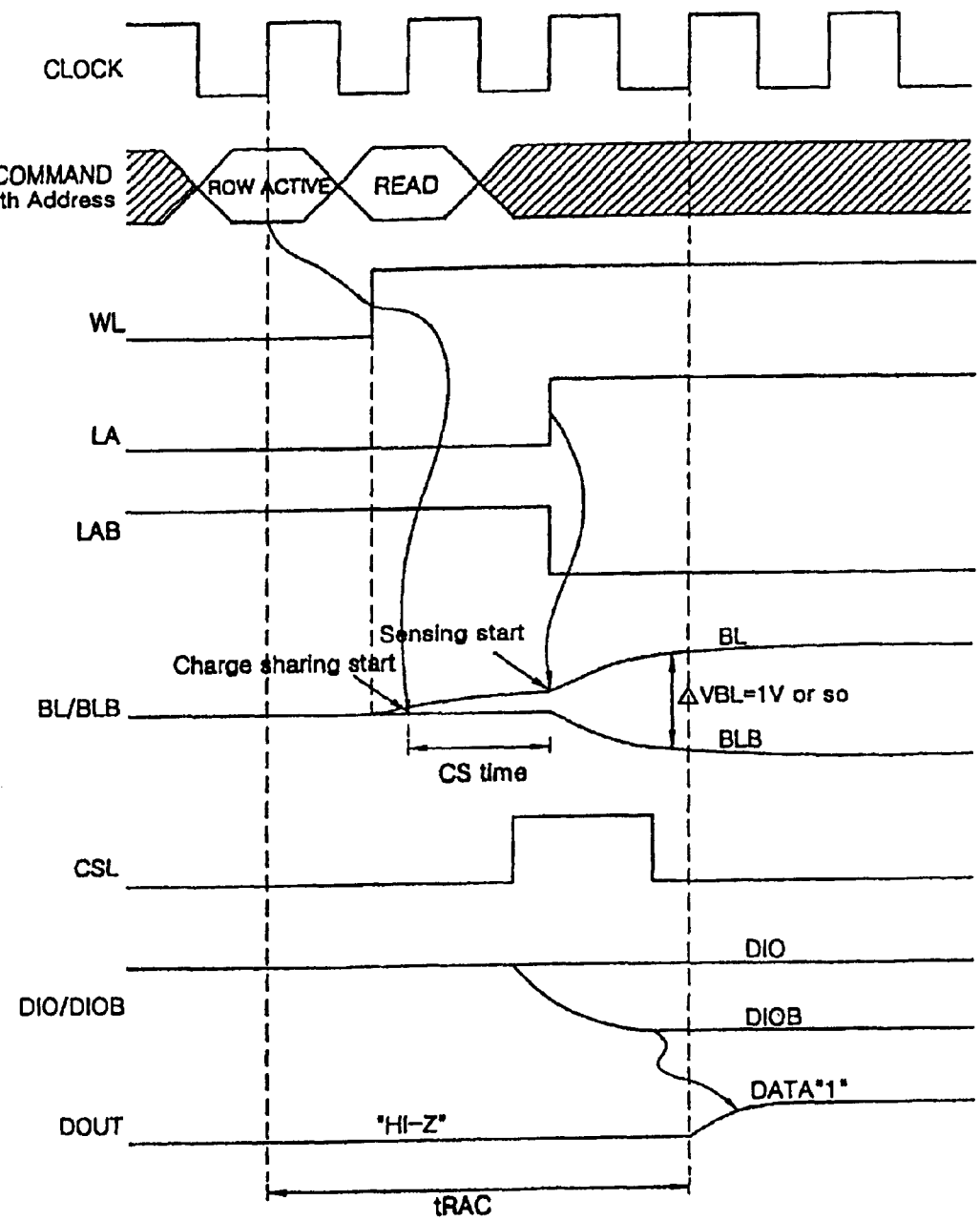
FIG. 4 is a timing diagram for the circuit of FIG. 3.

The RCSL operates during read operations, and the WCSL operates during write operations. The RSA can be a direct amplifier or differential amplifier. The load transistors L1 and L2 are shared by the RSA and data output sense amplifier. The load transistors L1 and L2 provide current to the data output sense amplifier 10. The timing diagram for the circuit shown in FIG. 6 is the same as the timing diagram shown in FIG. 4. However, the circuit in FIG. 6 requires a smaller layout area than the circuits shown in FIG. 3 or FIG. 5 and has a faster access time than the circuit shown in FIG. 1.

The BL/BLB data is amplified responding to the RCSL signal enabled high and then the amplified BL/BLB data is transferred to the DIO/DIOB lines. If the WCSL line is enabled high (write operation), data on the DIO/DIOB lines is transferred to the BL/BLB lines.

Figure 7:
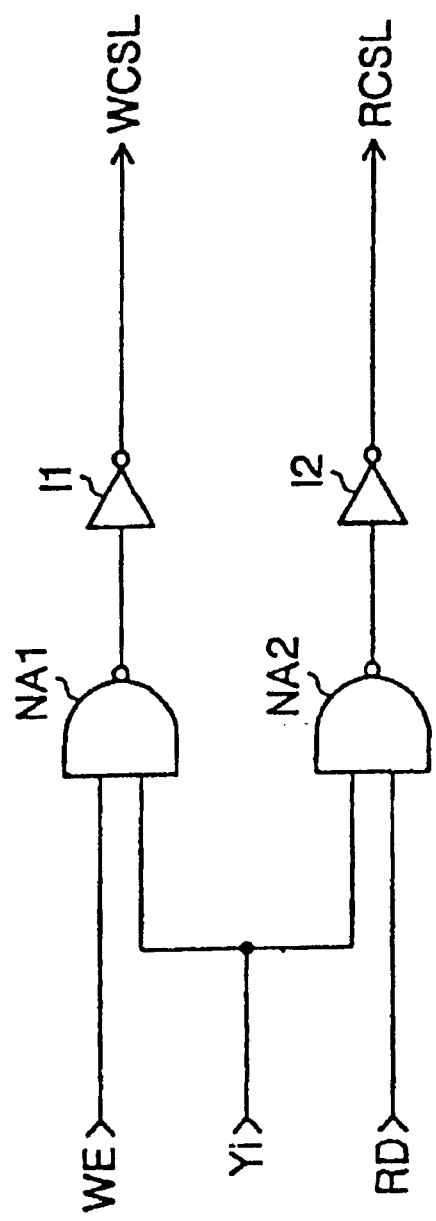
FIG. 7 is a diagram of a column select line circuit.
Figure 8A:
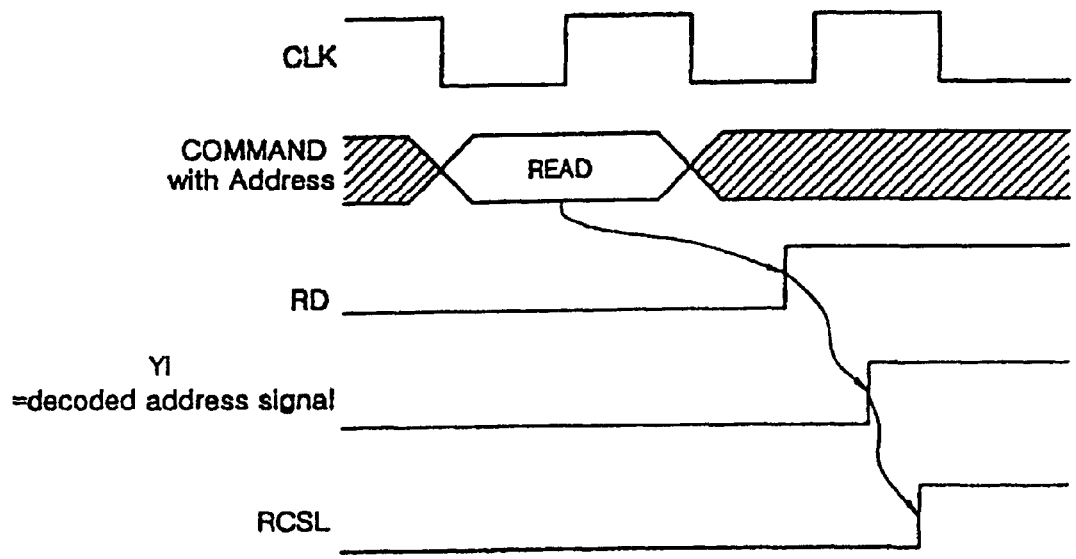
FIG. 8 is a timing diagram for the circuit shown in FIG. 7.
Figure 8B:
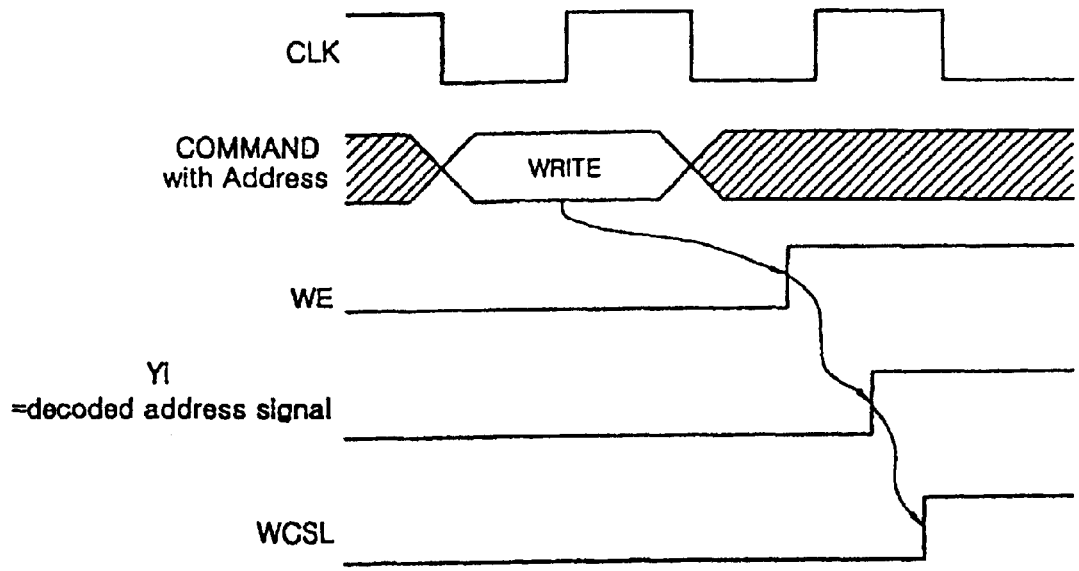

FIGS. 7–12 are circuits and timing diagrams showing operation of the RCSL and WCSL signals. The signals generated in FIGS. 7, 9, and 11 can be applied to the BLSA circuit of FIG. 6. FIG. 7 shows a conventional scheme for generating the CSL signals. A Write Enable (WE) signal is a write command or write-related signal. The RD signal is a read command or read-related signal. Yi is a decoded column address signal. In the case of FCRAMs, when RD and Yi are enabled high, the RCSL signal is enabled high, activating the RSA in FIG. 6. FIGS. 8a and 8b show the timing diagram of read and write operation of FIG. 7, respectively.

Figure 9:
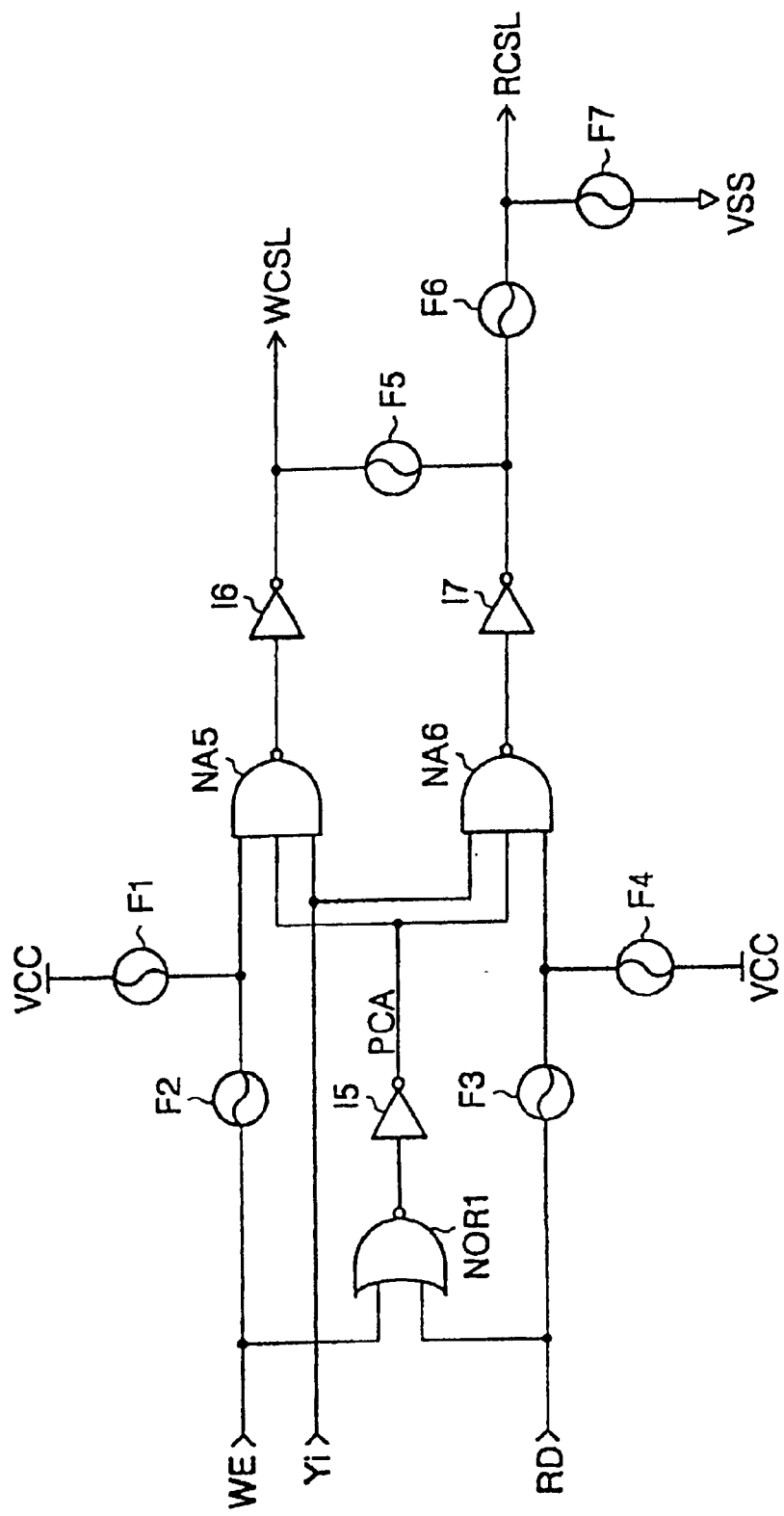
FIG. 9 is a configurable column select line circuit according to another aspect of the invention.

FIG. 9 shows another aspect of the invention showing a circuit that generates the WCSL and RCSL signals. A PCA signal is generated whenever a read or write operation is activated. In one configuration, fuses F1, F4, F5 and F7 are cut. In the write operation, logic-high PCA and logic-high Yi activates the WCSL signal while the RCSL signal is disabled. This causes the RSA in the FIG. 6 not to operate. In the read operation, the RCSL signal is enabled and RSA operates.

In another configuration, fuses F2, F3, and F6 are cut. The RCSL fixes at a ground voltage level (VSS) while the WE and RD signals are fixed at a power supply voltage level (VCC). In this configuration, the WCSL signal is used during both read and write operations. In this case inverters 15 and 16 both operate as drivers for the WCSL signal providing more current driving capability. This improves the WCSL enable timing.

Figure 10:
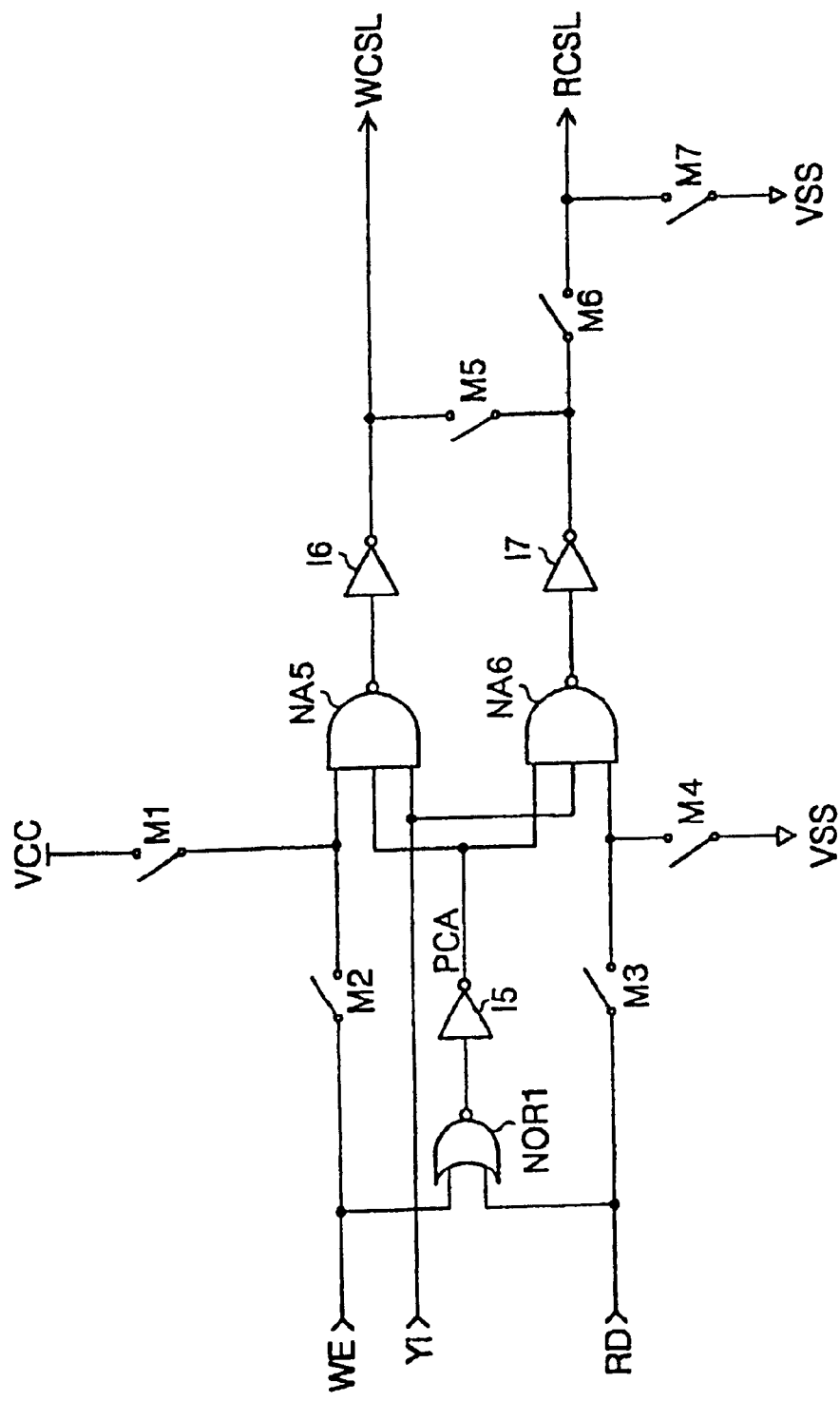
FIG. 10 is an alternative embodiment of the configurable column select line circuit.

FIG. 10 shows another embodiment of the invention where the fuses in FIG. 9 are replaced by a conducting layer like a metal line or poly-silicon line. Contacts M1–M7 represent conducting layers that have either been left open or closed by the metal or polysilicon line. The contacts M1–M7 are left open or closed in the same manner described above in FIG. 9 to enable WCSL and RCSL. For example, contacts M1, M2, M5 and M7 are left open and the remaining contacts are shorted. In this configuration, the write operation, logic-high PCA and logic-high Yi activates the WCSL signal while the RCSL signal is disabled. In the read operation, the RCSL signal is enabled and RSA operates. When contacts M2, M3 and M6 are left open and the remaining contacts shorted, WCSL is used during both read and write operations.

Figure 11A:
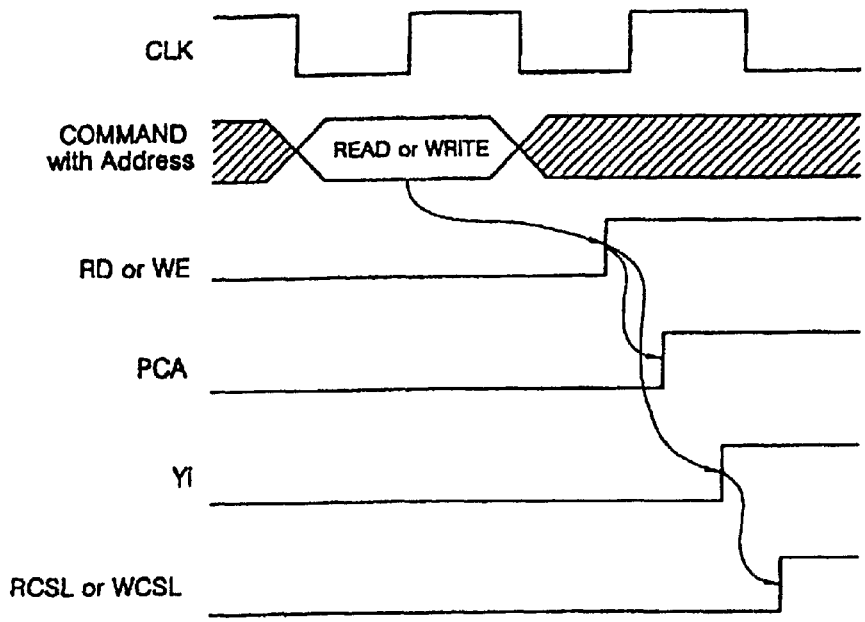
FIG. 11 is a timing diagram for the configurable column select line circuit.
Figure 11B:
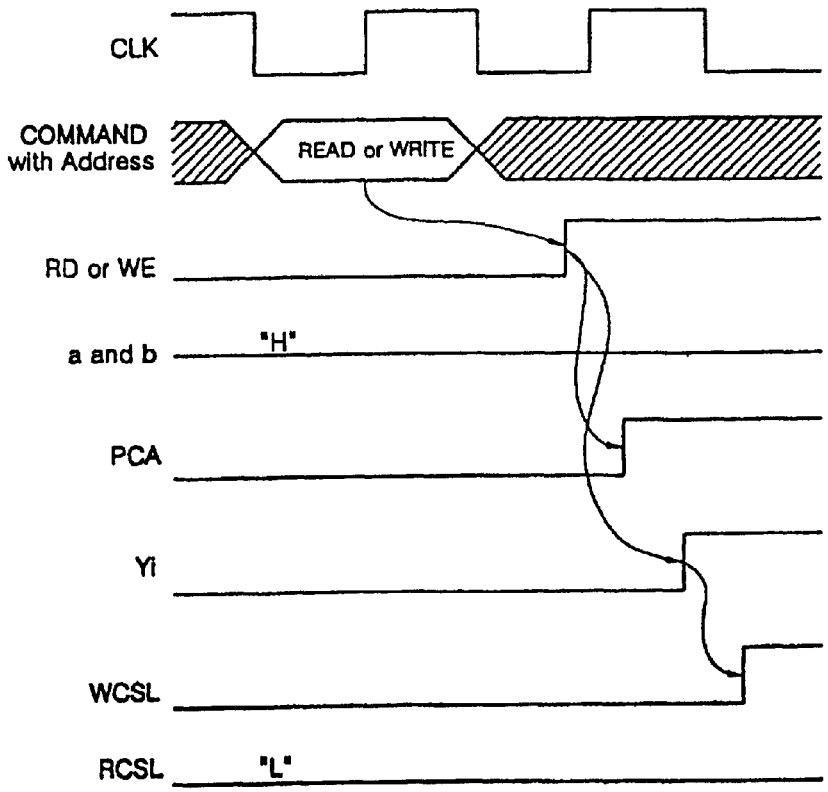

FIGS. 11a and 11b show the timing for the WCSL and RCSL signals of FIG. 9 and FIG. 10. FIG. 11a shows the timing when the fuses F1, F4, F5, and F7 are cut or the contacts M1, M4, M5 and M7 are left open. In this fuse configuration, the WCSL signal is enabled during a write operation and the RCSL signal is enabled during a read operation. The RCSL and WCSL signals generated in FIG. 11a are used for the circuit in FIG. 6. This CSL scheme provides faster DRAM access times.

FIG. 11b shows the timing in the case where fuses F2, F3 and F6 are cut or the contacts M2, M3 and M6 are left open and the remaining contacts shorted by the metal or polysilicon lines. In this case, the WCSL signal is enabled during both read and write operations. The RCSL signal is fixed at a ground voltage level (VSS).

Figure 12:
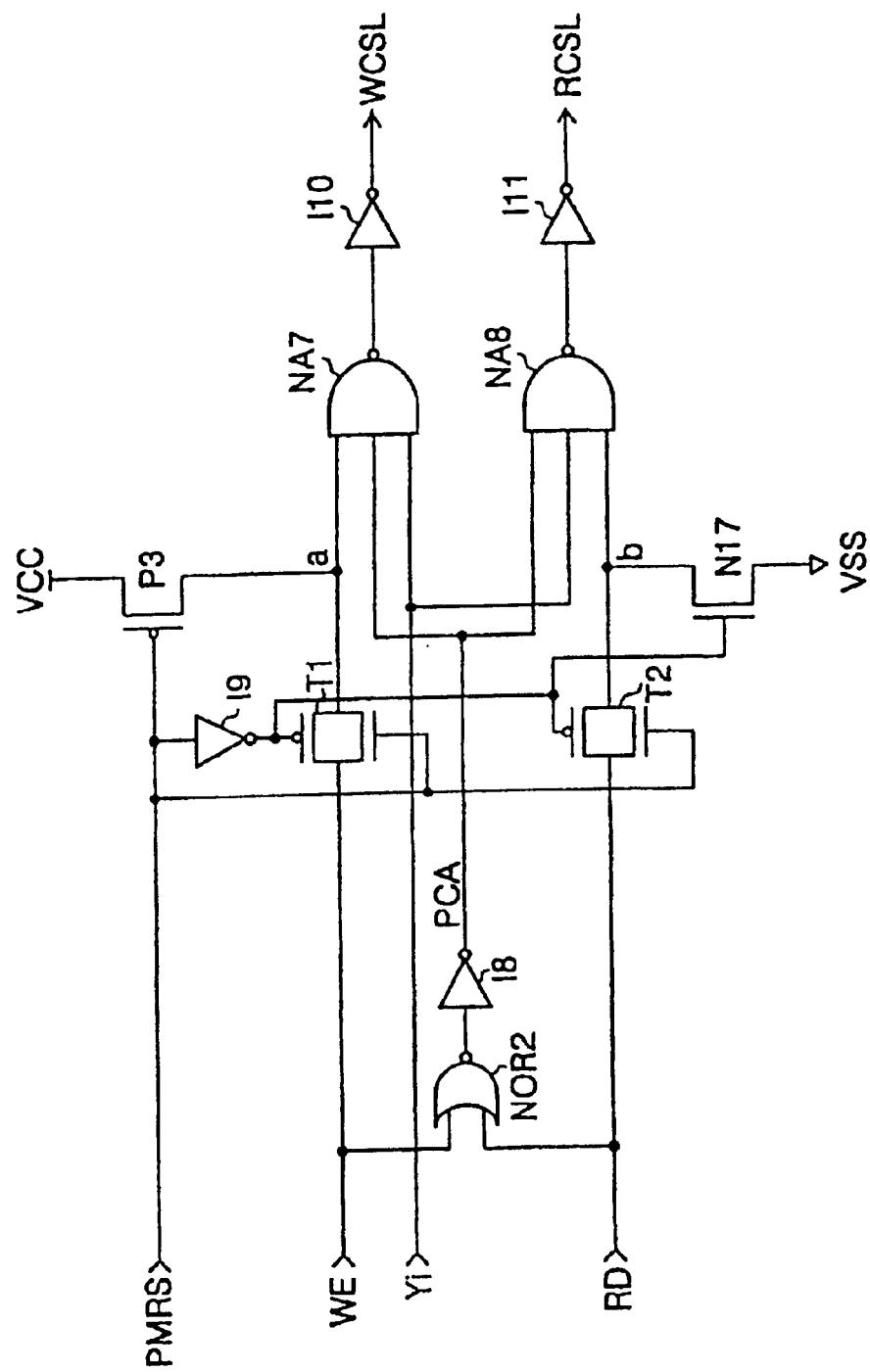
FIG. 12 is another embodiment of the configurable column select line circuit.

FIG. 12 shows another embodiment where a Mode Register Set (MRS) command or signal is generated in the DRAM immediately after power-up. The MRS may be programmed after power-up and before normal operation. In addition, the MRS may also be changed during normal operation. The MRS command, or signal is applied for initially determining how the DRAM operates. The MRS signal sets CL (CAS Latency), BL (Burst Length), etc., and is a combination of external command signals (CLOCK, CSB, RASB, CASB, WEB) and a plurality of addresses. (The CSB signal refers to a chip select signal and the RASB signals refers to a row address strobe signal. The CASB signals refers to a column address strobe signal and the WEB signal refers to a write enable signal. The last character "B" refers to a bar-triggered-enable signal.)

Figure 13A:
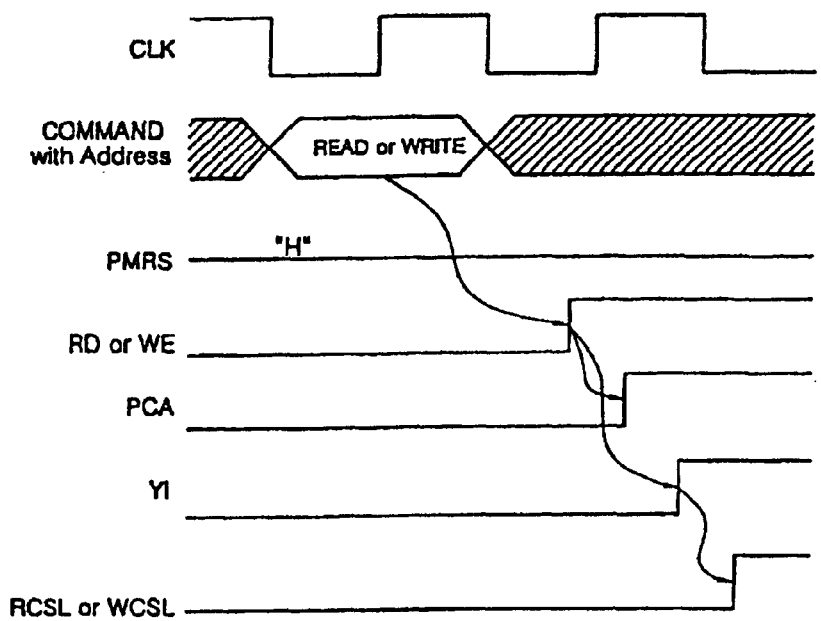
FIG. 13 is a timing diagram for the configurable column select line circuit shown in FIG. 12.
Figure 13B:
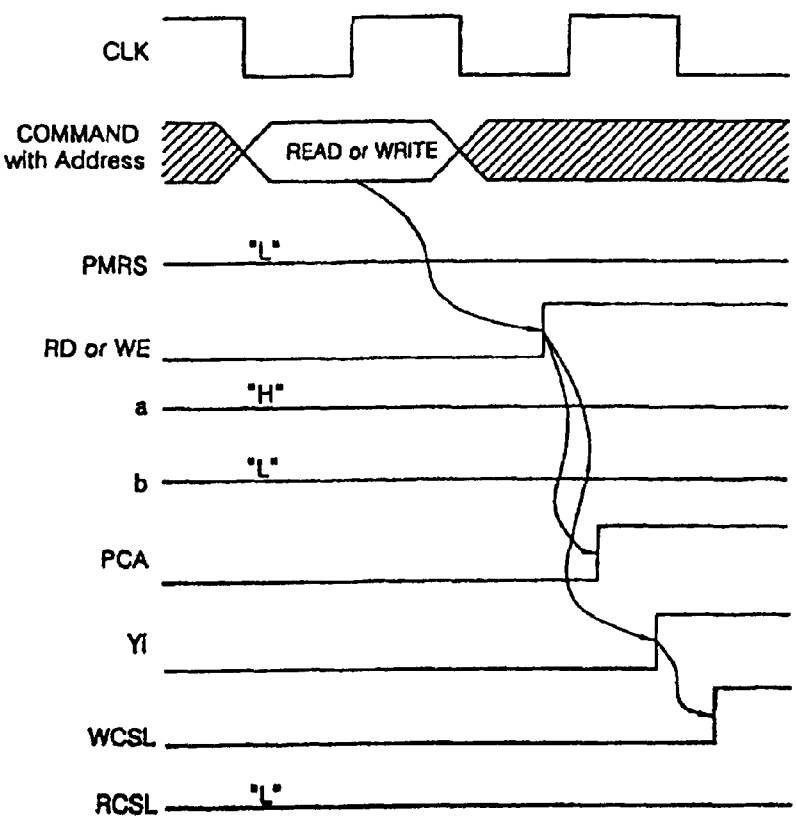

The device-internal signal of the MRS command is a PMRS signal like that of FIG. 12 and is described in detail in U.S. Pat. No. 6,084,803 in FIGS. 3, 4, 5A, 5B, 5C, and 5D and in the specification at col. 3, lines 40–67, col. 4, and col.5, which patent disclosure is herein incorporated by this reference. When the PMRS signal is set high, the WE and RD signals are not fixed at a voltage level, and the WCSL and RCSL signals are operated independently. This configuration is used for the FCRAM circuit shown in FIG. 6. When the PMRS signal has a logic-low setting, the WE and RD signal paths are blocked by the gate transistors (T1 and T2). The RCSL signal is set low by the PMRS signal and the WCSL is the only signal used as the CSL during the read and write operations. The PCA signal is then enabled during both read and write operations. The timing diagram for the two configurations of FIG. 12 are shown in FIGS. 13a and 13b.

Figure 14:
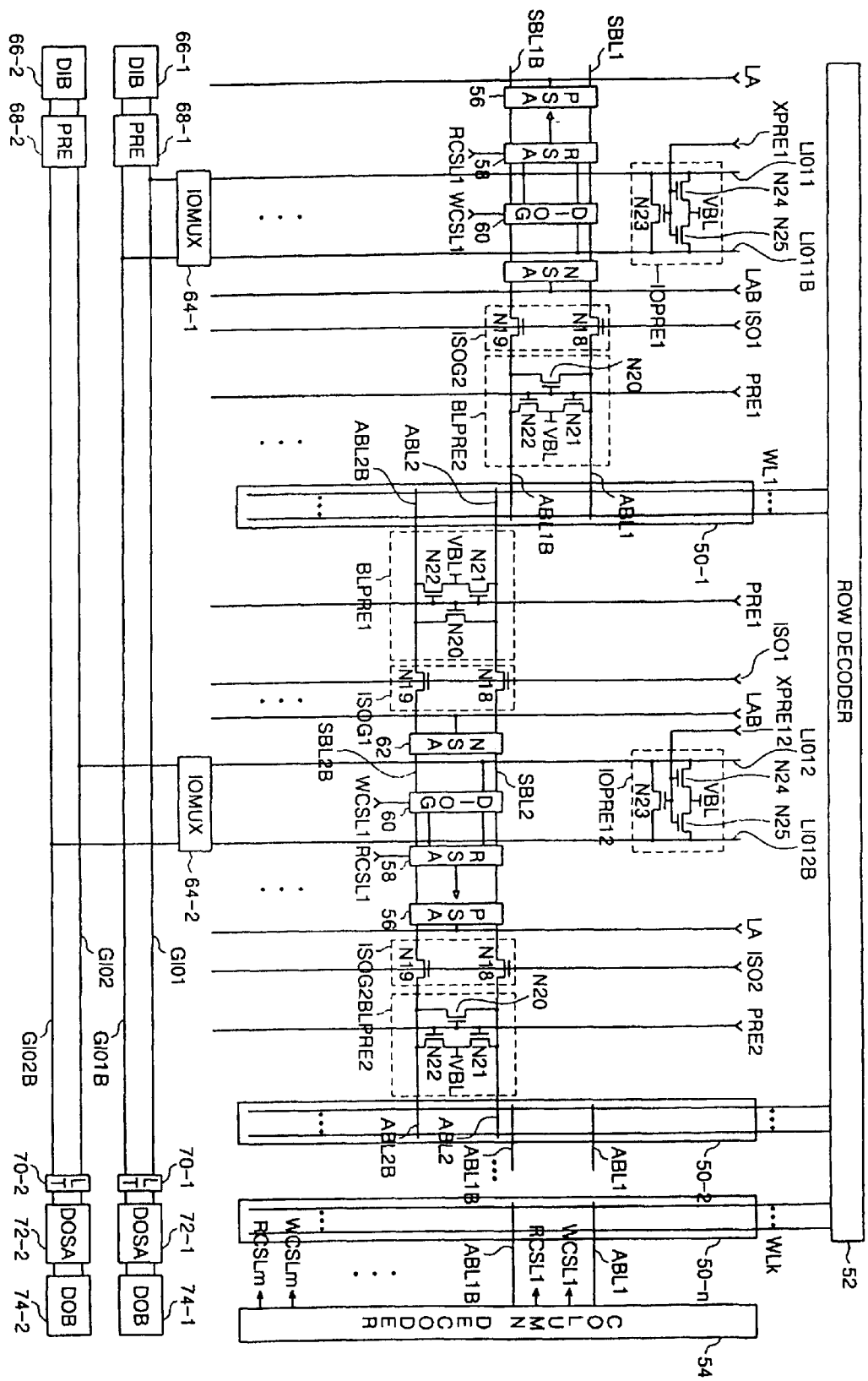
FIG. 14 shows a configuration of an embodiment of a semiconductor memory device comprising a sense amplifier of the present invention.

FIG. 14 shows a configuration of an embodiment of a semiconductor memory device of the present invention comprising a sense amplifier of FIG. 6. The semiconductor memory device comprises n memory cell array blocks 50-1 to 50-n, a row decoder 52, a column decoder 54, bit line pre-charge circuits BLPRE2 connected to left array bit line pairs (ABL1, ABL1B), (ABL2, ABL2B), . . . of the memory cell array blocks 50-1 to 50-n, respectively, bit line pre-charge circuits BLPRE1 connected to right array bit line pairs (ABL1, ABL1B), (ABL2, ABL2B), . . . of the memory cell array blocks 50-1 to 50-n, respectively, a PMOS sense amplifier PSA 56, a read sense amplifier RSA 58, a data input/output gate DIOG 60, and an NMOS sense amplifier NSA 62 connected to sense bit line pairs (SBL1, SBL1B), (SBL2, SBL2B), . . . of the memory cell array blocks 50-1 to 50-n, respectively, a bit line isolation gate ISOG2 connected between the left array bit line pairs (ABL1, ABL1B), (ABL2, ABL2B), . . . of each of the memory cell array blocks 50-1 to 50-n and the sense bit line pairs (SBL1, SBL1B), (SBL2, SBL2B) . . . , a bit line isolation gate ISOG1 connected between the right array bit line pairs (ABL1, ABL1B), (ABL2, ABL2B), . . . of each of the memory cell array blocks 50-1 to 50-n and the sense bit line pairs (SBL1, SBL1B), (SBL2, SBL2B), . . . , local data input/output line pre-charge circuits IOPRE1, IOPRE12, . . . , and data input/output multiplexers IOMUX 64-1 and 64-2, . . . connected to local data input/output line pairs (LIO11, LIO11B), (LIO12, LIO12B), . . . , data input buffers DIB 66-1 and DIB 66-2, global data input/output line pre-charge circuits PRE 68-1 and PRE 68-2, load transistors LT 70-1 and LT 70-2, data output sense amplifiers DOSA 72-1 and DOSA 72-2, and data output buffers DOB 74-1 and DOB 74-2.

In FIG. 14, a configuration of the PMOS sense amplifier 56, the read sense amplifier 58, the data input/output gate 60, and the NMOS sense amplifier 62 is the same as a circuit configuration of FIG. 6. Each of the data input/output gates ISO1, ISO2, . . . comprises NMOS transistors N18 and N19. Each of the bit line pre-charge circuits BLPRE1 and BLPRE2 comprises NMOS transistors N20, N21, and N22. Each of the data input/output line precharge circuits IOPRE1, IOPRE12, . . . comprises NMOS transistors N23, N24, and N25.

Each of the load transistors 70-1 and 70-2 comprises PMOS transistors L1 and L2 of FIG. 6. That is, each of the load transistors 70-1 and 70-2 is shared to the read sense amplifier 58 and the data output sense amplifiers 72-1 and 72-2 that are located on the left and on the right. NMOS sense amplifier NSA, the data input/output gate DIOG, the read sense amplifier RSA, and PMOS sense amplifier PSA connected in each of the sense bit line pairs (SBL1, SBL1B), (SBL2, SBL2B), . . . that is located between n memory cell array blocks 50-1 to 50-n are shared to the neighboring memory cell array blocks. FIG. 14 shows the bit line pairs of FIG. 6, which are separated into array bit line pairs and sense bit line pairs.

The function of each of the blocks shown in FIG. 14 is as follows.

The row decoder 52 decodes a row address to generate k word line select signals WL1 to WLk. The column decoder 54 decodes a column address to generate m write column select signals WCSL1 to WCSLm in a write operation, and generates m read column select signals RCSL1 to RCSLm in a read operation. If a signal LA at a level of the internal power voltage VINTA is applied, the PMOS sense amplifier 56 amplifies "high" level signals of bit line pairs (BL1, BL1B), (BL2, BL2B), . . . to the level of the internal power voltage VINTA. The read sense amplifier 58 amplifies voltage differences between the bit line pairs (BL1, BL1B), (BL2, BL2B), . . . with the load transistor 70-1 in response to a read column select signal RCSL during a read operation. The data input/output gate 60 transmits data of the local data input/output line pairs (LIO11, LIO11B), (LIO12, LIO12B), . . . to the bit line pairs (BL1, BL1B), (BL2, BL2B) in response to a write column select signal WCSL.

If a signal LAB of a ground voltage level is applied, then the NMOS sense amplifier NSA amplifies "low" level signals of the bit line pairs (BL1, BL1B), (BL2, BL2B), . . . to the ground voltage level. Each of the isolation gates ISOG1 and ISOG2 connects the array bit line pairs (ABL1, ABL1B), (ABL2, ABL2B), . . . with the sense bit line pairs (SBL1, SBL1B), (SBL2, SBL2B) in response to isolation control signals ISO1, ISO2, . . . , respectively. The bit line pre-charge circuits BLPRE1 and BLPRE2 pre-charge the array bit line pairs (ABL2, ABL2B), (ABL1, ABL1B), . . . to the voltage level VBL in response to pre-charge control signals PRE1, PRE2, . . . . Pre-charge control signals PRE1, PRE2, . . . are changed to a "high" level in a pre-charge operation, and transferred to a "low" level in response to each of block select signals BLK1, BLK12, . . . of "high" level. The data input/output line pre-charge circuits IOPRE1, IOPRE12, . . . pre-charge the local data input/output line pairs (LIO11, LIO11B), (LIO12, LIO12B), . . . to the voltage VBL level in response to a pre-charge control signal XPRE1, XPRE12, . . . . Pre-charge control signals XPRE1, XPRE12, . . . are charged to a "high" level in a pre-charge operation and changed to "low" level in response to the precharge control signals PRE1, PRE2, . . . of a "low" level. That is, if the pre-charge control signal PRE1 is transferred to a "low" level, then the pre-charge control signal XPRE1 is transferred to a "low" level, and if the pre-charge control signal PRE1 or the pre-charge control signal PRE2 is transferred to a "low" level, then the pre-charge control signal XPRE12 is transferred to a "low" level.

The block select signal BLK1 selects the memory cell array block 50-1, and the block select signal BLK12 selects the memory cell array block 50-1 or the memory cell array block 50-2. In other words, if the memory cell array block 50-1 or 50-2 is selected, then the block select signal BLK12 is transferred to a "high" level. Each of the data input/output multiplexers 64-1, 64-2, . . . transmits data between the corresponding local data input/output line pairs (LIO11, LIO11B), (LIO12, LIO12B), . . . and the global data input/output line pairs (GIO1, GIO1B), (GIO2, DIO2B), . . . in response to the block select signals BLK1 and BLK12, respectively. In a read operation, data of the corresponding local data input/output line pairs (LIO11, LIO11B), (LIO12, LIO12B), . . . is transmitted to the global data input/output line pairs (GIO1, GIO1B), (GIO2, GIO2B), . . . . In a write operation, data of the global data input/output line pairs (GIO1, GIO1B), (GIO2, DIO2B), . . . is transmitted to the corresponding local data input/output line pairs (LIO11, LIO11B), (LIO12, LIO12B), Each of the data input/output buffers 66-1 and 66-2 buffers data to output the buffered data to the global data input/output line pairs (GIO1, GIO1B), (GIO2, GIO2B) in a write operation. The global data input/output line pre-charge circuits 68-1 and 68-2 pre-charge the global data input/output line pairs (GIO1, GIO1B), (GIO2, GIO2B) to the voltage VBL level in a pre-charge operation, and pre-charge the global data input/output line pairs (GIO1, GIO1B), (GIO2, GIO2B) to the power voltage level in an active operation. Each of the data output sense amplifiers 72-1 and 72-2 amplifies data of the global data input/output line pairs (GIO1, GIO1B), (GIO2, GIO2B) with each of the load transistors (68-1, 68-2) in a read operation. Each of the data output buffers 74-1 and 74-2 buffers data of the data output sense amplifiers 72-1 and 72-2 and outputs the buffered data.

On the assumption that a word line select signal WL1 and a read column select signal RCSL1 to select memory cells of the memory cell array block 50-1 are generated, a read operation of the semiconductor memory device is as follows.

Before an active signal is applied, the bit line pre-charge circuits BLPRE1 and BLPRE2 pre-charge the array bit line pairs (ABL1, ABL1B), (ABL2, ABL2B), . . . , the sense bit line pairs (SBL1, SBL1B), (SBL2, SBL2B), . . . to the voltage VBL level in response to the pre-charge control signals PRE 1, PRE2, . . . , and the local data input/output line pre-charge circuits IOPRE1–IOPRE12, . . . pre-charge the local data input/output line pairs (LIO11, LIO11B), (LIO12, LIO12B), . . . to the voltage VBL level in response to the pre-charge control signals XPRE1, XPRE12, . . . . Also, the pre-charge circuits 68-1 and 68-2 pre-charge the global data input/output line pairs (GIO1, GIO1B), (GIO2, GIO2B).

If a row address is inputted with an active signal, the row decoder 52 decodes the row address to generate the word line select signal WL 1. Also, a block decoder (not shown) decodes a block address to generate block select signals BLK1 and BLK12 of the "high" level. Then, the pre-charge control signals XPRE1 and XPRE12 are transferred to the ground voltage level, and the isolation control signal ISO1 is transferred to a high voltage level. Therefore, the isolation gates ISOG1 and ISOG2 of the selected memory cell array block 501 are fully turned on in response to the isolation control signals ISO1 and ISO2. The data input/output multiplexers 64-1 and 64-2 are turned on in response to the "high" level block select signals BLK1 and BLK12. A charge sharing operation is performed between memory cells (not shown) connected to the word line select signal WL1 line and the array bit line pairs (ABL1, ABL1B), (ABL2, ABL2B) in response to the word line select signal WL1. Accordingly, a predetermined voltage difference is generated between the sense bit line pairs (SBL1, SBL1B), (SBL2, SBL2B). At this time, the PMOS sense amplifier 56 and the NMOS sense amplifier 62 amplify signals of the sense bit line pairs (SBL1, SBL1B), (SBL2, SBL2B), . . . to the power voltage level and the ground voltage level in response to the signals LA and LAB of the power voltage level and the ground voltage level.

If a column address is inputted with a read signal, the column decoder 54 decodes the column address to generate the read column select signal RCSL1. Then, the read sense amplifier RSA and the load transistors 70-1 and 70-2 are operated to amplify signals of the sense bit line pairs (SBL1, SBL1B), (SBL2, SBL2B) and transmit the amplified signals to the local data input/output line pairs (LIO11, LIO11B), (LIO12, LIO12B).

Even though it is not described more specifically, if the column address is inputted with a write signal in a write operation, then the column decoder 54 decodes the column address to generate the write column select signal WCSL1. Next, the data input/output gate 60 is turned on to transmit signal transmitted to the local data input/output line pairs (LIO11, LIO11B), (LIO12, LIO12B) to the sense bit line pairs (SBL1, SBL1B), (SBL2, SBL2B). At this time, the read column select signal is not generated, therefore the read sense amplifier 58 does not operate.

As a result, the semiconductor memory device comprising the sense amplifier of the present invention has advantages that decrease layout size compared to the conventional semiconductor memory device and reduce current consumption since the read sense amplifier operates during a read operation.

However, in the case of the semiconductor memory device comprising the sense amplifier of the present invention, if the read column select signal RCSL1 is generated, then the signal RCSL1 of the "high" level is applied to the read sense amplifiers 58 of the non-selected memory cell array blocks 50-2 to 50-n as well as to the read sense amplifier 58 of the selected memory cell array block 50-1. At this time, the sense bit line pairs (SBL1, SBL1B), (SBL2, SBL2B) of the read sense amplifier 58 of the non-selected memory cell array blocks 50-2 to 50-n are pre-charged to the voltage VINTA/2 level, and local data input/output line pairs (LIO23, LIO23B) to (LIOnn, LIOnnB) (not shown) are pre-charged to the voltage VBL level. Therefore, the NMOS transistors N6, N7 and N8 (shown in FIG. 6) of the read sense amplifier 58 for the non-selected memory cell array blocks 50-2 to 50-n to which the read column select signal RCSL1 of "high" level is applied are turned on. This causes an undesired current consumption through NMOS transistors N6, N7 and N8 comprising the read sense amplifier 58 from the local data input/output line pairs (LIO23, LIO23B) to (LIOnn, LIOnnB).

That is, in case the number of memory cell array blocks increases and the number of the read sense amplifiers 58 turned on in response to one read column select signal RCSL1 of "high" level increases, the current consumption of the read sense amplifiers 58 of the semiconductor memory device of the present invention shown in FIG. 14 cannot be negligible.

Figure 15:
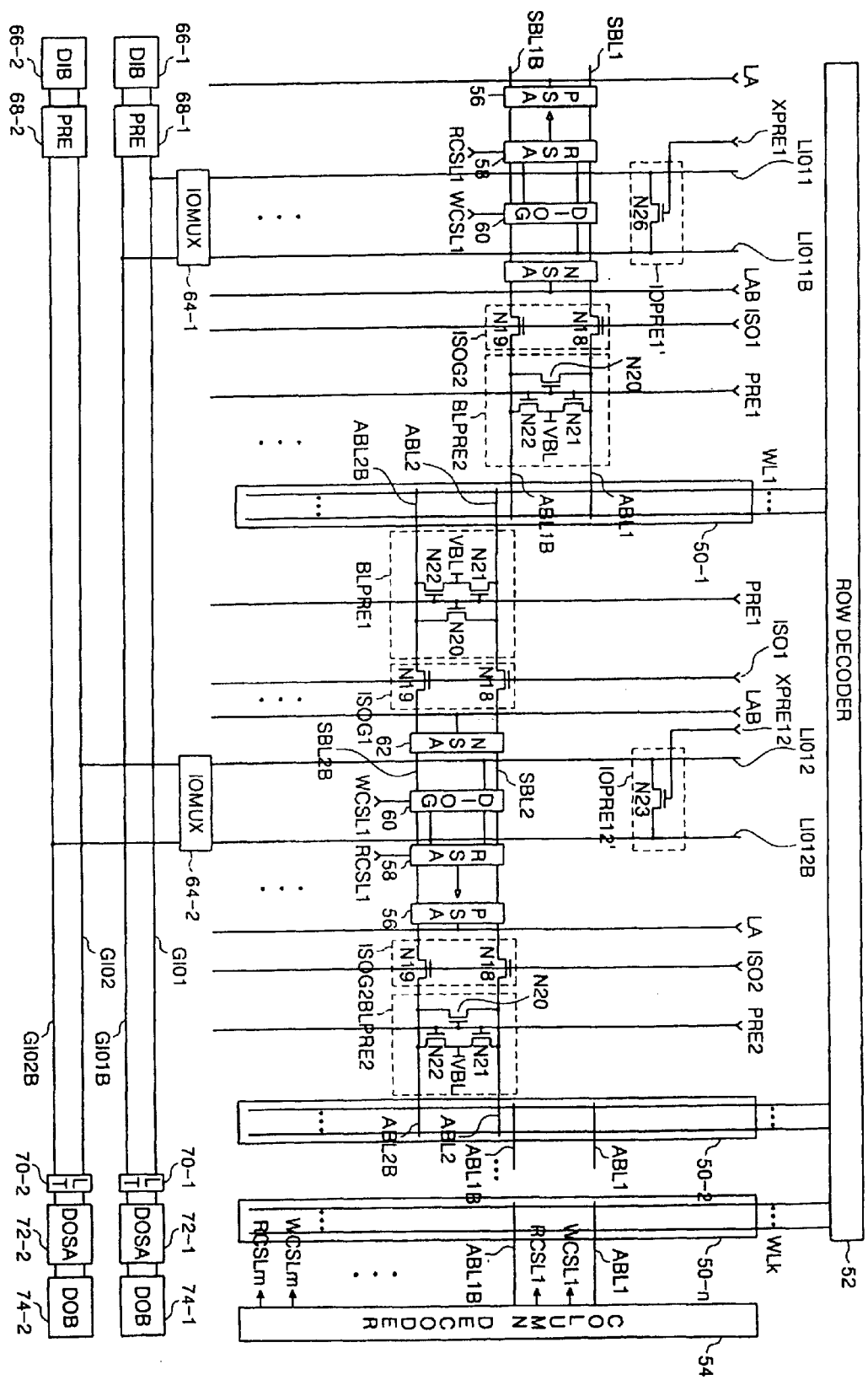
FIG. 15 shows a configuration of another embodiment of a semiconductor memory device comprising a sense amplifier of the present invention.

FIG. 15 shows a configuration of another embodiment of a semiconductor memory device comprising a sense amplifier of the present invention. The data input/output line precharge circuits IOPRE1, IOPRE12, . . . of FIG. 14 are replaced with the data input/output line pre-charge circuits IOPRE1', IOPRE12' . . . .

In FIG. 15, each of the data input/output line pre-charge circuits IOPRE1', IOPRE12', . . . comprises an NMOS transistor N26. The NMOS transistor N26 is connected between each of the local data input/output line pairs (LIO11, LIO11B), (LIO12, LIO12B), . . . .

An operation of the semiconductor memory device shown in FIG. 15 different from an operation of the semiconductor memory device shown in FIG. 14 will be described as follows.

In a pre-charge operation, the local data input/output line pairs (LIO11, LIO11B), (LIO12, LIO12B), . . . are floated in response to the pre-charge control signals XPRE1, XPRE12 . . . .

In an active operation, the pre-charge circuits 68-1 and 68-2 raise the global data input/output line pairs (GIO1, GIO1B), (GIO2, GIO2B) to power voltage levels. At this time, the data input/output multiplexers 64-1 and 64-2 connected to the local data input/output line pairs (LIO11, LIO11B), (LIO12, LIO12B) of the selected memory cell array block 50-1 are turned on. Therefore, the power voltage levels of the global data input/output line pairs (GIO1, GIO1B), (GIO2, GIO2B) are transmitted to the local data input/output line pairs (LIO11, LIO11B), (LIO12, LIO12B). However, the local data input/output line pairs of the non-selected memory cell array blocks 50-2 to 50-n retain the floating states.

In a read operation, data of the sense bit line pairs (SBL1, SBL1B), (SBL2, SBL2B) of the selected memory cell array block 50-1 are transmitted to the global data input/output line pairs (GIO1, GIO1B), (GIO2, GIO2B) through the local data input/output line pairs (LIO11, LIO11B), (LIO12, LIO12B). Thus, current consumption does not occur through the NMOS transistors N6, N7, and N8 (shown in FIG. 6) of the read sense amplifier 58 connected between each of the sense bit line pairs (SBL1, SBL1B), (SBL2, SBL2B), since the local data input/output line pairs for the non-selected memory cell array blocks 50-2 to 50-n retain their floating states.

Figure 16:
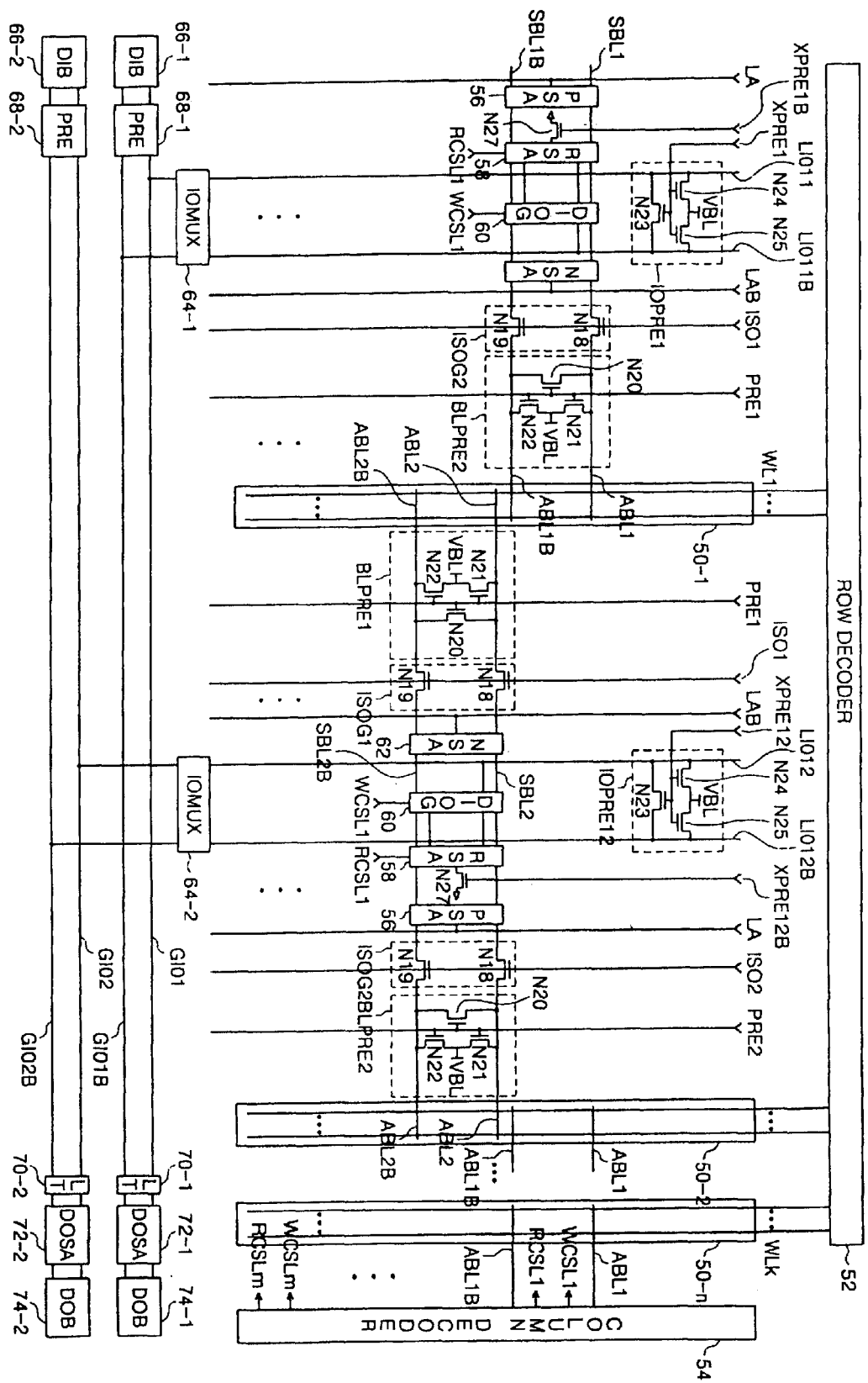
FIG. 16 shows a configuration of yet another embodiment of a semiconductor memory device comprising a sense amplifier of the present invention.

FIG. 16 shows a configuration of another embodiment of a semiconductor memory device using the sense amplifier of the present invention. NMOS transistors N27 are additionally connected to each of the read sense amplifier 58 of the semiconductor memory device shown in FIG. 14.

In FIG. 16, each of the NMOS transistors N27 is connected between the NMOS transistor N6 (shown in FIG. 6) of the read sense amplifier 58 and a ground voltage, and inverted pre-charge control signals XPRE1B, XPRE12B, . . . of the pre-charge control signals XPRE1, XPRE12, . . . are applied to its gates.

the operation of the semiconductor memory device shown in FIG. 16 will be described as follows, relating to the operation of the semiconductor memory device shown in FIG. 14.

A pre-charge operation of the semiconductor memory device shown in FIG. 16 is the same as the pre-charge operation of the semiconductor memory device shown in FIG. 14.

In an active operation, the NMOS transistors N27 connected to the read sense amplifier 58, which are connected between the sense bit line pairs (SBL1, SBL1B), (SBL2, SBL2B), . . . of the selected memory cell array block 50-1, are turned on in response to each of the inverted pre-charge control signals XPRE1B, XPRE12B. However, the NMOS transistors N27 connected to the read sense amplifier 58, which is connected between the sense bit line pairs (SBL1, SBL1B), (SBL2, SBL2B), . . . of the non-selected memory cell array blocks 50-2 to 50-n, are turned off. Operations of the other blocks are the same as the operation of the semiconductor memory device shown in FIG. 14.

In a read operation, if the read column select signal RCSL1 is generated, the read sense amplifier RSA connected between the sense bit line pairs (SBL1, SBL1B), (SBL2, SBL2B) of the selected memory cell array block 50-1 amplifies signals of the sense bit line pairs (SBL1, SBL1B), (SBL2, SBL2B), and transmits the amplified signal to the local data input/output line pairs (LIO11, LIO11B), (LIO12, LIO12B). However, operation of the read sense amplifier RSA connected between the sense bit line pairs (SBL1, SBL1B), (SBL2, SBL2B) of the non-selected memory cell array blocks 50-2 to 50-n is disabled. Therefore, it is possible to prevent current consumption through the read sense amplifier RSA from local data input/output line pairs (not shown) of the non-selected memory cell array blocks 50-2 to 50-n.

Therefore, the semiconductor memory device comprising the sense amplifier of the present invention can reduce the layout size as well as decreasing current consumption, since the read sense amplifier of the non-selected memory cell array blocks does not operate in a write operation.

In addition, when the memory cell arrays are configured as a plurality of memory cell array blocks, the invention can prevent a undesired current consumption incurred by operation of the read sense amplifiers of the non-selected memory cell array blocks. The system described above can use dedicated processor systems, microcontrollers, programmable logic devices, or microprocessors that perform some or all of the operations. Some of the operations described above may be implemented in software and other operations may be implemented in hardware.

For the sake of convenience, the operations are described as various interconnected functional blocks or distinct software modules. This is not necessary, however, and there may be cases where these functional blocks or modules are equivalently aggregated into a single logic device, program or operation with unclear boundaries. In any event, the functional blocks and software modules or features of the flexible interface can be implemented by themselves, or in combination with other operations in either hardware or software.

Having described and illustrated the principles of the invention in a preferred embodiment thereof, it should be apparent that the invention may be modified in arrangement and detail without departing from such principles. I claim all modifications and variation coming within the spirit and scope of the following claims.

What is claimed is:

1. A semiconductor memory device comprising:
   a plurality of memory cell array blocks having a plurality of memory cells connected between a plurality of word lines and a plurality of complementary bit line pairs, the blocks being selected in response to a plurality of block select signals;
   a predetermined number of complementary local data input/output line pairs of each of the plurality of memory cell array blocks transmitting data to the plurality of complementary bit line pairs of each of the plurality of memory cell array blocks;
   a circuit comprising a read charge control circuit activated by a read signal and an address and a write charge control circuit activated by a write signal and the same or a different address, the circuit being connected to each of the plurality of complementary bit line pairs; and
   a floating circuit being connected between each of the predetermined complementary local data input/output line pairs, the floating circuit establishing the predetermined complementary local data input/output line pairs of non-selected memory cell array blocks among the memory cell array blocks at floating states,
   wherein the read charge control circuit comprises:
      a first transistor having a first terminal connected to a bit line and a second terminal and a third terminal connected to a complementary local data input/output line and a common node, respectively;
      a second transistor having first terminal connected to a complementary bit line and a second terminal and a third terminal connected to a local data input/output line and the common node, respectively; and
      a third transistor having a first terminal controlled by the read signal and the column address and a second terminal and a third terminal connected to the common node and a ground voltage, respectively.

2. A semiconductor memory device comprising:
   a plurality of memory cell array blocks having a plurality of memory cells connected between a plurality of word lines and a plurality of complementary bit line pairs, the blocks being selected in response to a plurality of block select signals;
   a predetermined number of complementary local data input/output line pairs of each of the plurality of memory cell array blocks transmitting data to the plurality of complementary bit line pairs of each of the plurality of memory cell array blocks;
   a circuit comprising a read charge control circuit activated by a read signal and an address and a write charge control circuit activated by a write signal and the same or a different address, the circuit being connected to each of the plurality of complementary bit line pairs; and
   a floating circuit being connected between each of the predetermined complementary local data input/output line pairs, the floating circuit establishing the predetermined complementary local data input/output line pairs of non-selected memory cell array blocks among the memory cell array blocks at floating states,
   wherein the write charge control circuit comprises:
      a fourth transistor having a first terminal controlled by the write signal and the same or different column address, and a second terminal and a third terminal connected to the bit line and the local data input/output line, respectively; and
      a fifth transistor having a first terminal controlled by the write signal and the same or different column address, and a second terminal and a third terminal connected to the complementary bit line and the complementary local data input/output line, respectively.

3. A semiconductor memory device comprising:
   a plurality of memory cell array blocks having a plurality of memory cells connected between a plurality of word lines and a plurality of complimentary bit line pairs, the blocks being selected in response to a plurality of block select signals;
   a predetermined number of complementary local data input/output line pairs of each of the plurality of memory cell array blocks transmitting data to the plurality of complementary bit line pairs of each of the plurality of memory cell array blocks;
   a circuit comprising a read charge control circuit activated by a read signal and an address and a write charge control circuit activated by a write signal and the same or a different address, the circuit being connected to each of the plurality of complementary bit line pairs; and
   a floating circuit being connected between each of the predetermined complementary local data input/output line pairs, the floating circuit establishing the predetermined complementary local data input/output line pairs of non-selected memory cell array blocks among the memory cell array blocks at floating states,
   wherein the floating circuit comprises:
      a sixth transistor having a first terminal controlled in response to the block select signal, and a second terminal and a third terminal connected to the local data input/output line and the complementary local data input/output line, respectively.

4. A semiconductor memory device comprising:
   a plurality of memory cell array blocks having a plurality of memory cells connected between a plurality of word lines and a plurality of complementary bit line pairs, and being selected in response to a plurality of block select signals;
   a predetermined number of complementary local data input/output line pairs of each of the plurality of memory cell array blocks transmitting data to the plurality of complementary bit line pairs of each of the plurality of memory cell array blocks;
   a circuit comprising a read charge control circuit activated by the block select signal, a read signal and an address and a write charge control circuit activated by a write signal and the same or a different address, the circuit being connected to each of the plurality of complementary bit line pairs; and
   a pre-charge circuit being connected between each of the predetermined complementary local data input/output line pairs of each of the plurality of memory cell array block, and pre-charging each of the complementary local data input/output line pairs, wherein the read charge control circuit comprises:
  a first transistor having a first terminal connected to a bit line, and a second terminal and a third terminal connected to a complementary local data input/output line and a first node, respectively;
  a second transistor having a first terminal connected to a complementary bit line, and a second terminal and a third terminal connected to a local data input/output line and the first node, respectively;
  a third transistor having a first terminal controlled by the read signal and the column address and a second terminal and a third terminal connected to the first node and a second node, respectively; and
  a fourth transistor having a first terminal in response to the block select signal and a second terminal and a third terminal connected to the second node and a ground voltage, respectively.

5. A semiconductor memory device comprising:

a plurality of memory cell array blocks having a plurality of memory cells connected between a plurality of word lines and a plurality of complementary bit line pairs, and being selected in response to a plurality of block select signals;

a predetermined number of complementary local data input/output line pairs of each of the plurality of memory cell array blocks transmitting data to the plurality of complementary bit line pairs of each of the plurality of memory cell array blocks;

a circuit comprising a read charge control circuit activated by the block select signal, a read signal and an address and a write charge control circuit activated by a write signal and the same or a different address, the circuit being connected to each of the plurality of complementary bit line pairs; and a pre-charge circuit being connected between each of the predetermined complementary local data input/output line pairs of each of the plurality of memory cell array block, and pre-charging each of the complementary local data input/output line pairs, wherein the write charge control circuit comprises:
  a fifth transistor having a first terminal controlled by the write signal and the same or different column address, and a second terminal and a third terminal connected to the bit line and the local data input/output line, respectively; and
  a sixth transistor having a first terminal controlled by the write signal and the same or different column address, and a second terminal and a third terminal connected to the complementary bit line and the complementary local data input/output line, respectively.

* * * * *

UNITED STATES PATENT AND TRADEMARK OFFICE
CERTIFICATE OF CORRECTION

PATENT NO.    : 6,643,201 B2
DATED         : November 4, 2003
INVENTOR(S)   : Lee et al.

It is certified that error appears in the above-identified patent and that said Letters Patent is hereby corrected as shown below:

Title page,
Item [30], Foreign Application Priority Data, "Jan. 2, 2002   (KR)………….
2002-0000087" should read -- Jan. 2, 2002   (KR) ………..2002-00087 --.

Column 7,
Line 21, "the precharge control" should read -- the pre-charge control --.
Line 47, "LIO12B), Each" should read -- LIO12B),… Each --.

Column 8,
Line 6, "signals PRE 1, PRE2," should read -- signals PRE1, PRE2, --.
Line 7, "circuits IOPRE1-IOPRE12," should read -- circuits IOPRE1, IOPRE12, --.
Line 16, "signal WL 1. Also," should read -- signal WL1. Also, --.
Line 23, "block 501 are" should read -- block 50-1 are --.

Column 9,
Line 29, "precharge circuits" should read -- pre-charge circuits --.
Line 45, "XPRE12…." should read -- XPRE12, … --.

Signed and Sealed this

Twenty-ninth Day of June, 2004

JON W. DUDAS
*Acting Director of the United States Patent and Trademark Office*